United States Patent
Takaoka

(10) Patent No.: US 10,403,380 B2
(45) Date of Patent: Sep. 3, 2019

(54) SEMICONDUCTOR DEVICE HAVING AN ANTI-FUSE ELEMENT AND METHOD FOR SUPPRESSING THE EXPANSION OF THE CELL CURRENT DISTRIBUTION TO IMPROVE THE WRITING YIELD THEREOF

(71) Applicant: Renesas Electronics Corporation, Tokyo (JP)

(72) Inventor: Hiromichi Takaoka, Ibaraki (JP)

(73) Assignee: RENESAS ELECTRONCIS CORPORATION, Tokyo (JP)

( * ) Notice: Subject to any disclaimer, the term of this patent is extended or adjusted under 35 U.S.C. 154(b) by 0 days.

(21) Appl. No.: 15/631,263

(22) Filed: Jun. 23, 2017

(65) Prior Publication Data
US 2018/0005704 A1    Jan. 4, 2018

(30) Foreign Application Priority Data

Jun. 30, 2016    (JP) ................................. 2016-130389

(51) Int. Cl.
| | |
|---|---|
| *G11C 17/16* | (2006.01) |
| *G11C 17/18* | (2006.01) |
| *H01L 23/525* | (2006.01) |
| *H01L 23/528* | (2006.01) |

(Continued)

(52) U.S. Cl.
CPC ............ *G11C 17/165* (2013.01); *G11C 17/16* (2013.01); *G11C 17/18* (2013.01); *H01L 23/528* (2013.01); *H01L 23/5252* (2013.01); *H01L 27/11206* (2013.01); *H01L 29/0649* (2013.01); *H01L 29/0684* (2013.01)

(58) Field of Classification Search
CPC ... G11C 17/165; G11C 17/18; H01L 23/5252; H01L 23/528; H01L 27/11206
See application file for complete search history.

(56) References Cited

U.S. PATENT DOCUMENTS

| | | | | | |
|---|---|---|---|---|---|
| 6,816,427 | B2 * | 11/2004 | Novosel | ................. | G11C 17/16 |
| | | | | | 365/225.7 |
| 6,956,772 | B2 * | 10/2005 | Forbes | ............... | G11C 16/0466 |
| | | | | | 365/185.18 |

(Continued)

FOREIGN PATENT DOCUMENTS

| | | |
|---|---|---|
| JP | 2006-059919 A | 3/2006 |
| JP | 2009-054662 A | 3/2009 |

(Continued)

*Primary Examiner* — Mushfique Siddique
(74) *Attorney, Agent, or Firm* — McDermott Will & Emery LLP

(57) ABSTRACT

A semiconductor device with an anti-fuse element includes a semiconductor substrate, a well region of a first conductivity type formed in the semiconductor substrate, and a gate electrode formed over the semiconductor substrate through a gate insulating film, and source regions of a second conductivity type opposite to the first conductivity type formed within the well region at the both ends of the gate electrode. When writing in the fuse element, a first writing potential is applied to the gate electrode, a first reference potential is applied to the well region, an intermediate potential is supplied to the source regions, and the intermediate potential is lower than the first writing potential and higher than the first reference potential.

8 Claims, 12 Drawing Sheets

(51) Int. Cl.
*H01L 27/112* (2006.01)
*H01L 29/06* (2006.01)

(56) References Cited

U.S. PATENT DOCUMENTS

| | | | |
|---|---|---|---|
| 7,157,782 B1 * | 1/2007 | Shih | H01L 27/0203 257/50 |
| 7,544,968 B1 * | 6/2009 | Toutounchi | H01L 27/1021 257/50 |
| 7,573,118 B2 | 8/2009 | Kushida | |
| 7,852,656 B2 * | 12/2010 | Shin | G11C 17/18 365/225.7 |
| 7,880,211 B2 | 2/2011 | Shin et al. | |
| 8,179,709 B2 * | 5/2012 | Ogawa | G11C 17/16 257/50 |
| 8,519,508 B2 | 8/2013 | Kubota et al. | |
| 2004/0071007 A1 * | 4/2004 | Pecheyran | G11C 17/16 365/145 |
| 2007/0097743 A1 * | 5/2007 | Fang | G11C 16/0416 365/185.05 |
| 2008/0237673 A1 * | 10/2008 | Wada | G11C 5/145 257/299 |
| 2008/0258217 A1 * | 10/2008 | Chen | H01L 23/5252 257/347 |
| 2011/0075500 A1 * | 3/2011 | Kodama | G11C 17/16 365/225.7 |
| 2012/0026810 A1 * | 2/2012 | Onuma | G11C 17/18 365/189.16 |

FOREIGN PATENT DOCUMENTS

| | | |
|---|---|---|
| JP | 2009-200497 A | 9/2009 |
| JP | 2011-119640 A | 6/2011 |

* cited by examiner

SEMICONDUCTOR DEVICE HAVING AN ANTI-FUSE ELEMENT AND METHOD FOR SUPPRESSING THE EXPANSION OF THE CELL CURRENT DISTRIBUTION TO IMPROVE THE WRITING YIELD THEREOF

CROSS-REFERENCE TO RELATED APPLICATIONS

The disclosure of Japanese Patent Application No. 2016-130389 filed on Jun. 30, 2016 including the specification, drawings and abstract is incorporated herein by reference in its entirety.

BACKGROUND

The invention relates to a semiconductor device and more particularly, it is preferably applied to a semiconductor device including a fuse element in a semiconductor substrate.

A semiconductor device having a memory formed of a semiconductor element formed in a semiconductor substrate includes that one having a memory cell including an anti-fuse element. This semiconductor device writes data into a memory cell by applying a high voltage between a gate electrode of the anti-fuse element and a source and drain region, to dielectrically break down a gate insulating film of the anti-fuse element. In this writing operation, according to the dielectric breakdown of the gate insulating film of the anti-fuse element, a reading current as a gate leak current increases before and after the writing operation.

The dielectric breakdown of the gate insulating film of the anti-fuse element is performed only once and therefore, the writing into the memory cell including the above anti-fuse element is referred to as One Time Program (OTP). The memory element including the anti-fuse element is referred to as One Time Programmable (OTP) memory element and used for Read Only Memory (ROM).

The anti-fuse element is disclosed in, for example, Japanese Unexamined Patent Application Publication No. 2006-59919, Japanese Unexamined Patent Application Publication NO. 2011-119640, Japanese Unexamined Patent Application Publication No. 2009-54662, and Japanese Unexamined Patent Application Publication No. 2009-200497.

SUMMARY

The inventor et al. have found the following problems in a semiconductor device with a plurality of memory cells including anti-fuse elements of MOS structure arranged in a matrix shape.

The anti-fuse element includes a gate electrode formed on the surface of a semiconductor substrate (or well region) through a gate insulating film and a pair of source regions formed on the surface of the semiconductor substrate at the both ends of the gate electrode.

In the writing into a memory cell, a predetermined voltage is applied to the gate insulating film of the selected anti-fuse element, to form a dielectric breakdown region in the gate insulating film, and further a filament of lower resistance is formed in the dielectric breakdown region, hence to make the both conductive. In the reading operation performed after the writing operation, when a reading voltage is applied to the gate electrode, a predetermined current and more (cell current) flows between the gate electrode and the pair of the source regions through the filament in a writing cell. On the other hand, in a non-writing cell, a very small current of the gate leak flows. A change in the cell current caused by the writing is worked as bit information.

It is found that in the writing into a plurality of memory cells, the writing state is different among the plural memory cells and that the cell current at the reading time widely ranges. In other words, in the plural memory cells, there is a bit with a lower cell current, which causes degradation of the writing yield.

A semiconductor device having an anti-fuse element is required to suppress the expansion of the cell current distribution to improve the writing yield.

Other problems and novel features will be apparent from the description of the specification and the attached drawings.

The semiconductor device according to one embodiment has an anti-fuse element including a semiconductor substrate, a first semiconductor region of a first conductivity type formed in the semiconductor substrate, a gate electrode formed over the semiconductor substrate through a gate insulating film, and second and third semiconductor regions of a second conductivity type opposite to the first conductivity type formed in the first semiconductor region at the both ends of the gate electrode. When writing in the anti-fuse element, a first potential is supplied to the gate electrode, a second potential is supplied to the first semiconductor region, a third potential is supplied to the second semiconductor region and the third semiconductor region, and the third potential is lower than the first potential and higher than the second potential.

According to one embodiment, it is possible to improve the reliability of a semiconductor device through the improvement of the writing yield.

DETAILED DESCRIPTION

Figure 1:
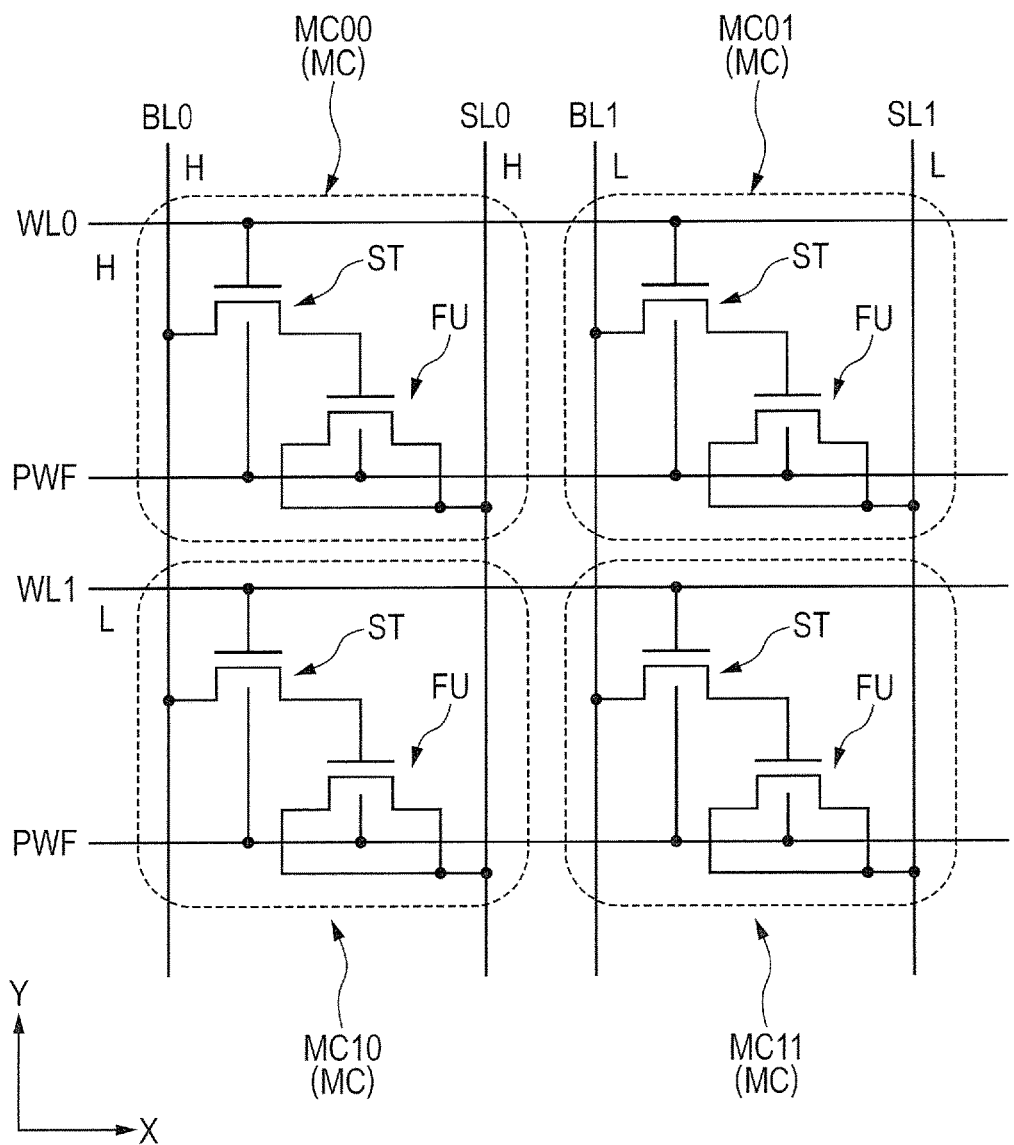
FIG. 1 is an equivalent circuit diagram of a memory cell in a semiconductor device according to an embodiment.

The following embodiments will be described divided into a plurality of sections or forms if necessary for the sake of convenience; unless otherwise specified, they are related to each other and one is related to the other in a part or in the whole of the modified examples as the details and supplementary description.

Further, in case of referring to the number of the elements (including piece, numeric value, amount, and range), in the following embodiments, the number is not restricted to the specified number but may be more or less than the specified number, unless particularly specified and unless restricted to the specified number apparently on the principle.

Further, in the following embodiments, it is needless to say that the component elements (including operation step) are not always essential unless particularly specified and unless apparently considered compulsory on the principle.

Similarly, in the following embodiments, when referring to the shape and the positional relation of the component elements, they are to include their similarity or approximation unless particularly specified and unless they have apparently different shape and positional relation on the principle. This is true to the above numeric value and range.

Further, in the whole drawings for describing the embodiments, the same reference numerals are attached to the same components and their repeated description is omitted. Further, even in a top plan view, hatching may be given in order to make the drawings easy to view.

Embodiment

A semiconductor device according to one embodiment includes a plurality of memory cells arranged in a matrix shape, each memory cell (also referred to bit) including a select transistor and an anti-fuse element. The semiconductor device according to the embodiment is to improve the writing yield by narrowing the cell current distribution in a plurality of writing cells to reduce the bits with lower cell current.

At first, the technical problem of the semiconductor device in the related art, confirmed by the inventor et al. will be described by using FIGS. 9 to 12.

Figure 9:
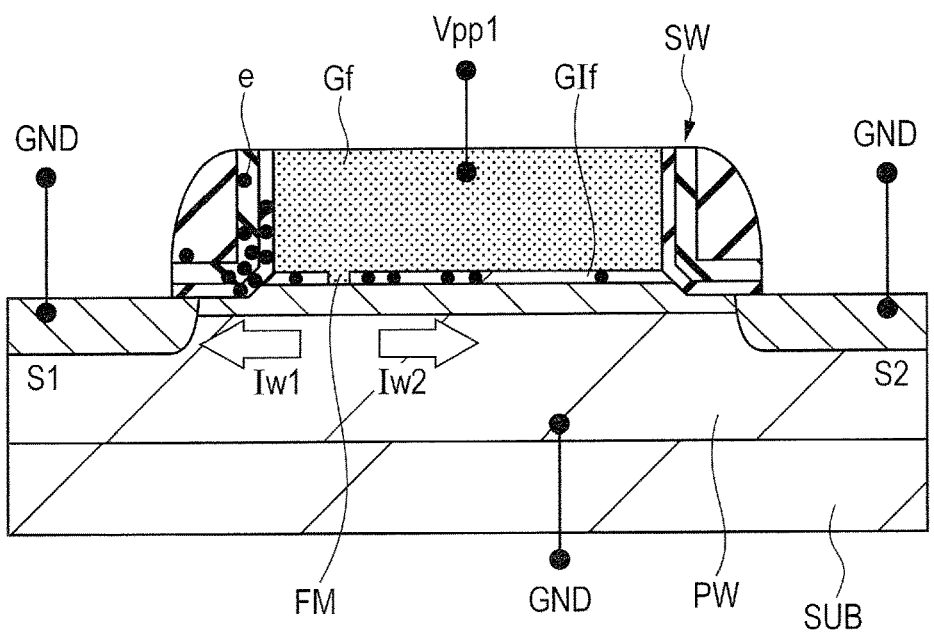
FIG. 9 is a cross-sectional view showing an anti-fuse element and each potential supplied when writing, in the related art.
Figure 10:
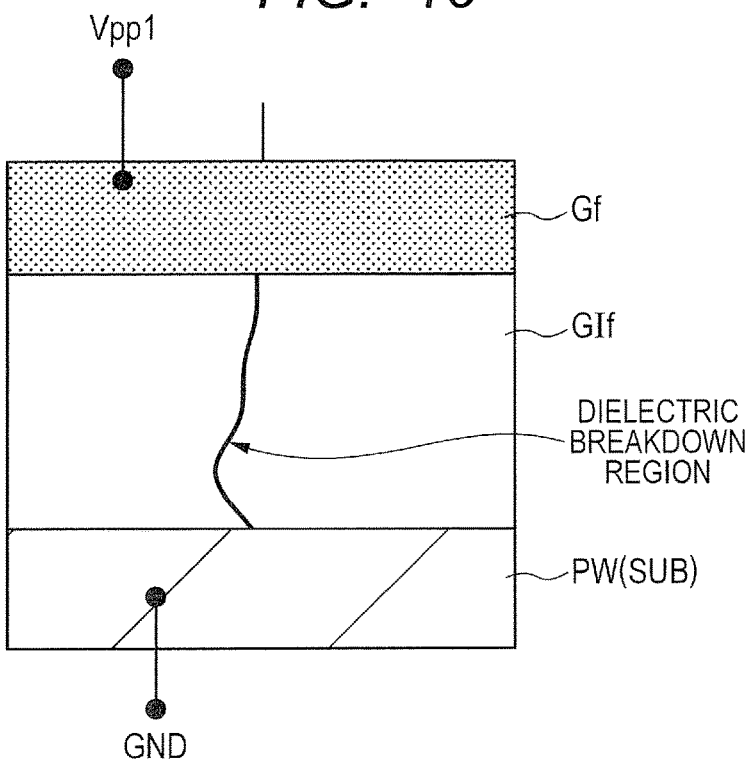
FIG. 10 is a cross-sectional view showing a writing mechanism of the anti-fuse element in the related art.
Figure 11:
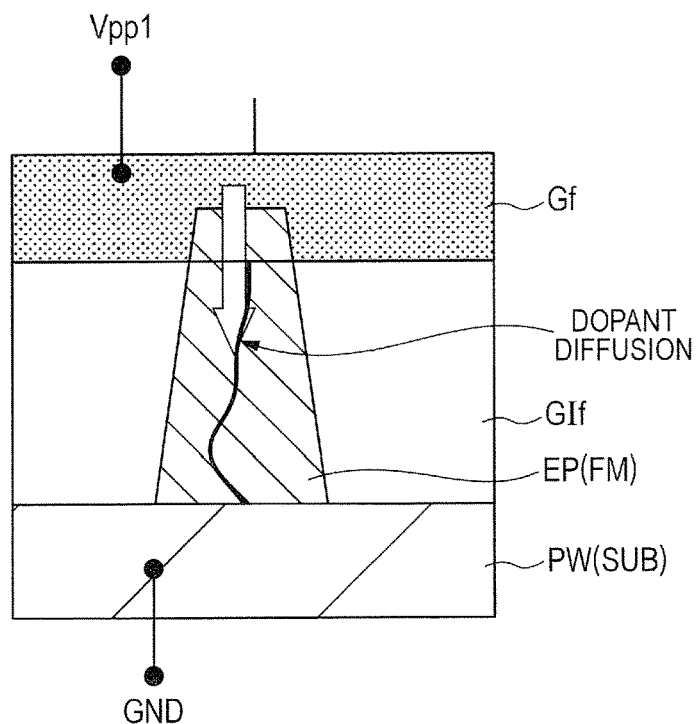
FIG. 11 is a cross-sectional view showing a writing mechanism of the anti-fuse element in the related art.
Figure 12:
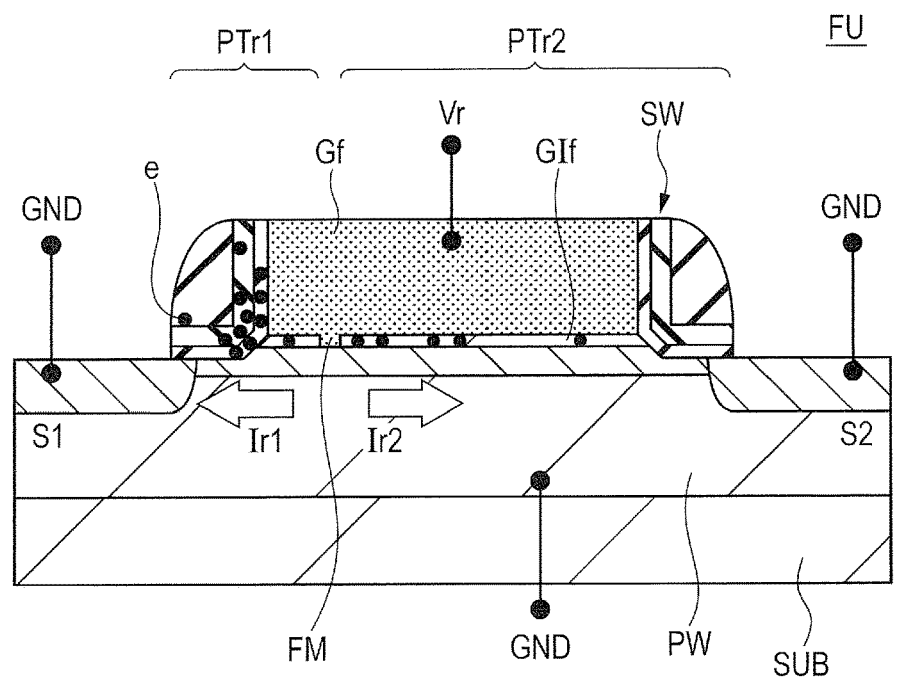
FIG. 12 is a cross-sectional view showing the anti-fuse element and each potential supplied when reading in the related art.

FIG. 9 is a cross-sectional view showing an anti-fuse element and each potential supplied when writing in the related art. FIGS. 10 and 11 are cross-sectional views showing the writing mechanism of the anti-fuse element in the related art. FIG. 12 is a cross-sectional view showing the anti-fuse element and each potential supplied when reading in the related art.

As shown in FIG. 9, the anti-fuse element FU includes a p-type semiconductor substrate SUB, a p-type well region PW formed on the main surface of the semiconductor substrate SUB, a gate electrode Gf formed on the surface of the well region PW through a gate insulating film GIf, source regions S1 and S2 formed within the well region PW at the both ends of the gate electrode Gf, and a side wall insulating film SW formed on the side wall of the gate electrode Gf. Here, the semiconductor substrate SUB is formed of, for example, a single crystal silicon substrate or an epitaxial substrate with an epitaxial layer formed on the single crystal silicon substrate, the well region PW is a p-type semiconductor region, and the source regions S1 and S2 are n-type semiconductor regions. The gate insulating film GIf is an insulating film made of, for example, silicon oxide, and the gate electrode Gf is a conductive film made of, for example, polycrystalline silicon containing phosphorus (P) as the dopant. The side wall insulating film SW is a stacked insulating film including, for example, a silicon nitride film and two silicon oxide films sandwiching the above film.

FIG. 9 shows the anti-fuse element FU after the writing, and a filament FM is formed in a part of the gate insulating film GIf. In other words, the filament FM is not formed in a memory cell before the writing or a non-writing memory cell but the gate insulating film GIf covers the whole between the gate electrode Gf and the semiconductor substrate SUB (or the well region PW).

When writing in the anti-fuse element FU, a first writing potential Vpp1 is applied to the gate electrode Gf and a first reference potential GND is applied to the source regions S1 and S2 and the well region PW. The first writing potential Vpp1 is, for example, 6V and the first reference potential GND is 0 V.

The writing process includes two stages as shown in FIGS. 10 and 11. At first, as shown in FIG. 10, in the first stage, a dielectric breakdown region is formed in the gate insulating film GIf according to a potential difference between the gate electrode Gf and the well region in the semiconductor substrate PW(SUB). The dielectric breakdown region ranges from the gate electrode Gf to the well region PW, and a writing current flows in the dielectric breakdown region from the gate electrode Gf to the well region PW. As shown in FIG. 11, the writing current keeps flowing in the dielectric breakdown region of high resistance, the dielectric breakdown region becomes high temperature, and as the result, the epitaxial layer EP grows as filament EP(FM) from the well region in the semiconductor substrate PW(SUB) to the gate electrode Gf. In other words, an epitaxial layer EP made of silicon layer is formed around the dielectric breakdown region, ranging from the semiconductor substrate SUB to the gate electrode Gf. Further, the phosphorus (P) included in the gate electrode Gf is diffused to the epitaxial layer EP, to form an n-type semiconductor layer (conductive layer) connecting the semiconductor substrate SUB and the gate electrode Gf, in the gate insulating film GIf. This n-type semiconductor layer (conductive layer) is referred to as a filament FM. The filament FM forming process after forming the above mentioned dielectric breakdown region is the second stage. The filament FM has a lower resistance compared with the dielectric breakdown region.

As shown in FIG. 9, since the potential of the semiconductor substrate SUB is equal to that of the source regions S1 and S2 when writing, the dielectric breakdown region, in other words, the filament FM is hard to control the forming position thereof. Specifically, the filament FM is to be formed in the middle portion of the gate electrode Gf, on the side of the source region S1 or the source region S2, in a direction of coupling the source regions S1 and S2. FIG. 9 shows an example of forming the filament FM on the side of the source region S1.

During the writing, the writing current keeps flowing even after forming the above mentioned dielectric breakdown region and filament EM in order to form the filament FM of a lower resistance: a writing current Iw1 flows from the filament EM to the side of the source region S1 and a current Iw2 flows from the filament EM to the side of the source region S2. Here, when the forming position of the filament FM is deviated (near) to the side of the source region S1, an electric field between the filament FM and the source region S1 gets higher than that between the filament FM and the source region S2. In other words, a high electric field occurs between the filament FM and the source region S1, hence to generate a large amount of hot electrons e, and as shown by the black dot in FIG. 9, the hot electrons e are trapped in the gate insulating film GIf or the side wall insulating film SW on the side of the source region S1 in large quantities. Although the hot electrons e are also trapped in the gate insulating film GIf on the side of the source region S2, that amount is less than that on the side of the source region S1.

As shown in FIG. 12, during the reading, a reading potential Vr (for example, 1.5 V) is applied to the gate electrode Gf and a first reference potential GND is applied to the source regions S1 and S2 and the well region PW. In the "writing cell", a cell current Ir1 flows according to a parasitic transistor PTr1 formed between the gate electrode Gf and the source region S1 and a cell current Ir2 flows according to a parasitic transistor PTr2 formed between the gate electrode Gf and the source region S2, hence to detect the writing state of the memory cell. In short, when the sum of the cell currents Ir1 and Ir2 becomes a predetermined current value and more, it is determined as the "writing cell" and when it becomes less than the predetermined value, it is determined as the "non-writing cell".

As shown in FIG. 12, however, since a large amount of hot electrons e are trapped in the gate insulating film GIf and the side wall insulating film SW on the side of the source region S1, a threshold value of the parasitic transistor PTr1 rises, to reduce the cell current Ir1. Further, since the filament FM is formed nearer to the source region S1 from the middle point between the source regions S1 and S2, the channel length of the parasitic transistor PTr2 is more increased than in the case of forming the filament FM in the middle point between the source regions S1 and S2 and the cell current Ir2 is also reduced. When the filament FM is formed deviated to the side of the source region S1 from the middle point of the source regions S1 and S2, the cell current (the sum of the cell currents Ir1 and Ir2) is extremely reduced according to an increase in the above hot electrons e and the above channel length, which makes it difficult to determine "writing cell" or "non-writing cell". This means the deterioration in the writing yield of the memory cell. Needless to say, when the filament FM is deviated to the side of the source region S2, similarly the cell current is reduced.

According to the semiconductor device of the embodiment, the filament FM is formed at the middle position between the source regions S1 and S2, to increase the cell current of the writing cell in the anti-fuse element and to narrow the cell current distribution of the writing cell, hence to improve the writing yield.

<Structure of Semiconductor Device>

Figure 2:
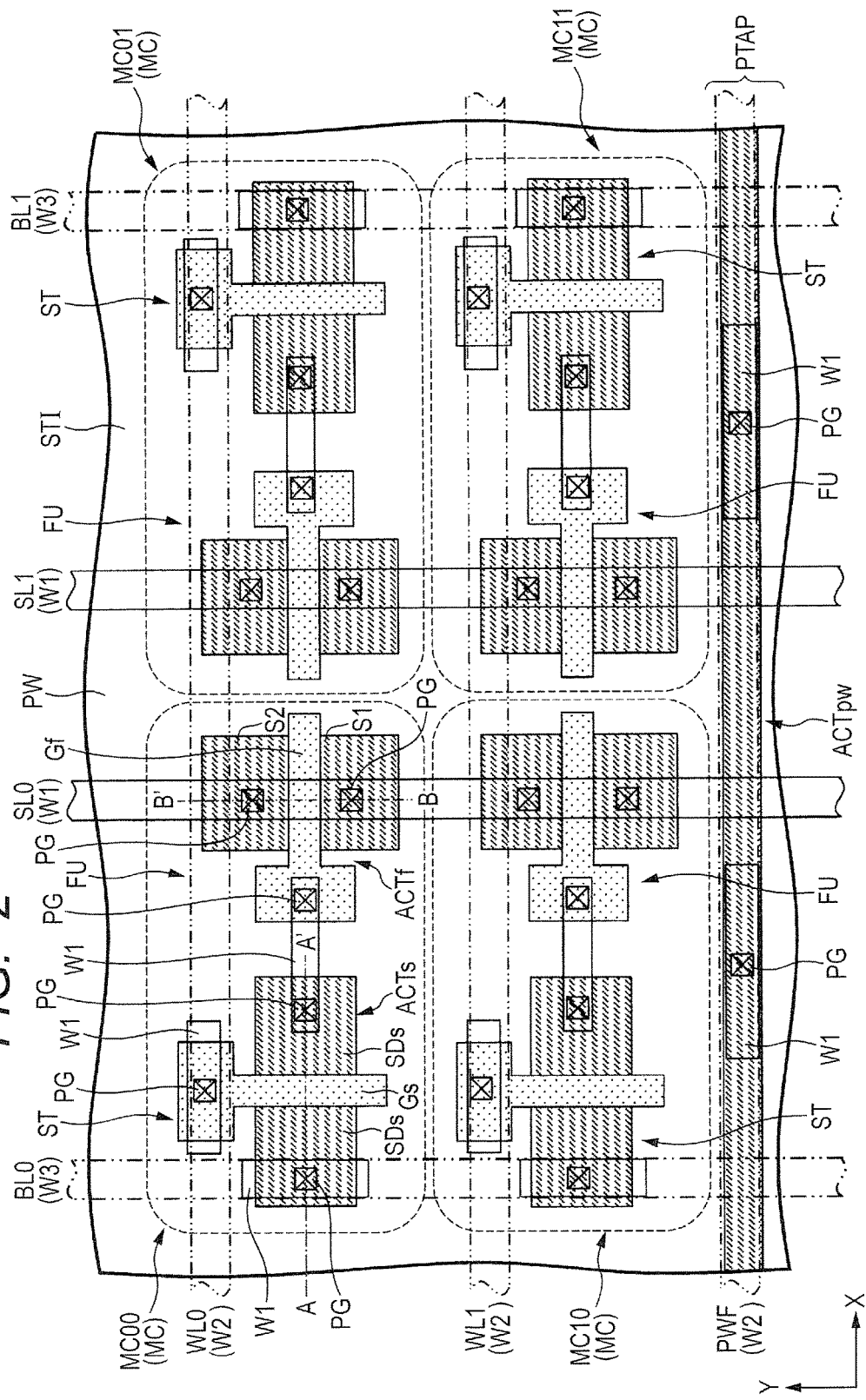
FIG. 2 is a top plan view of an important portion of the memory cell in the semiconductor device according to the embodiment.
Figure 3:
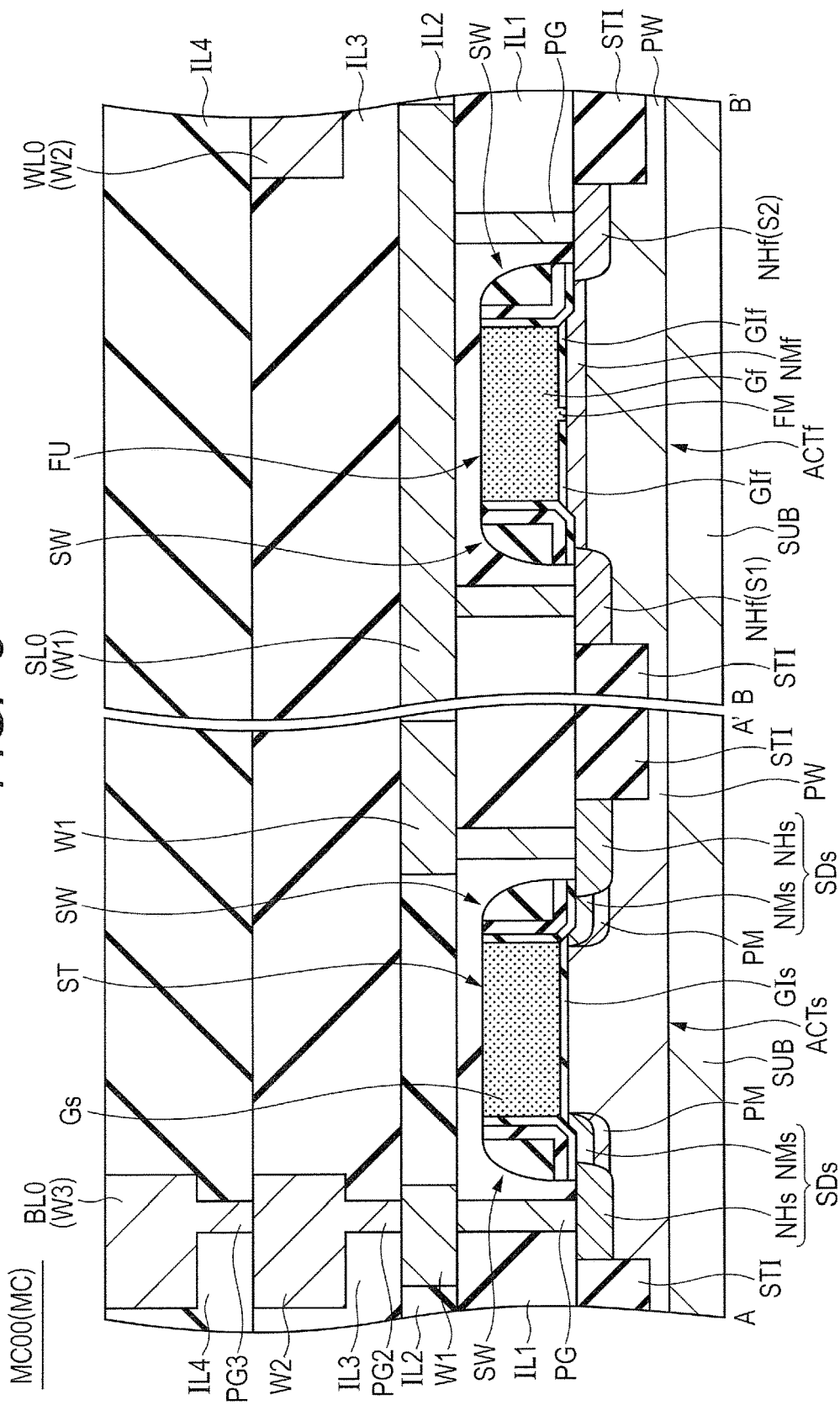
FIG. 3 is a cross-sectional view taken along the line A-A' and the line B-B' of FIG. 2.
Figure 4:
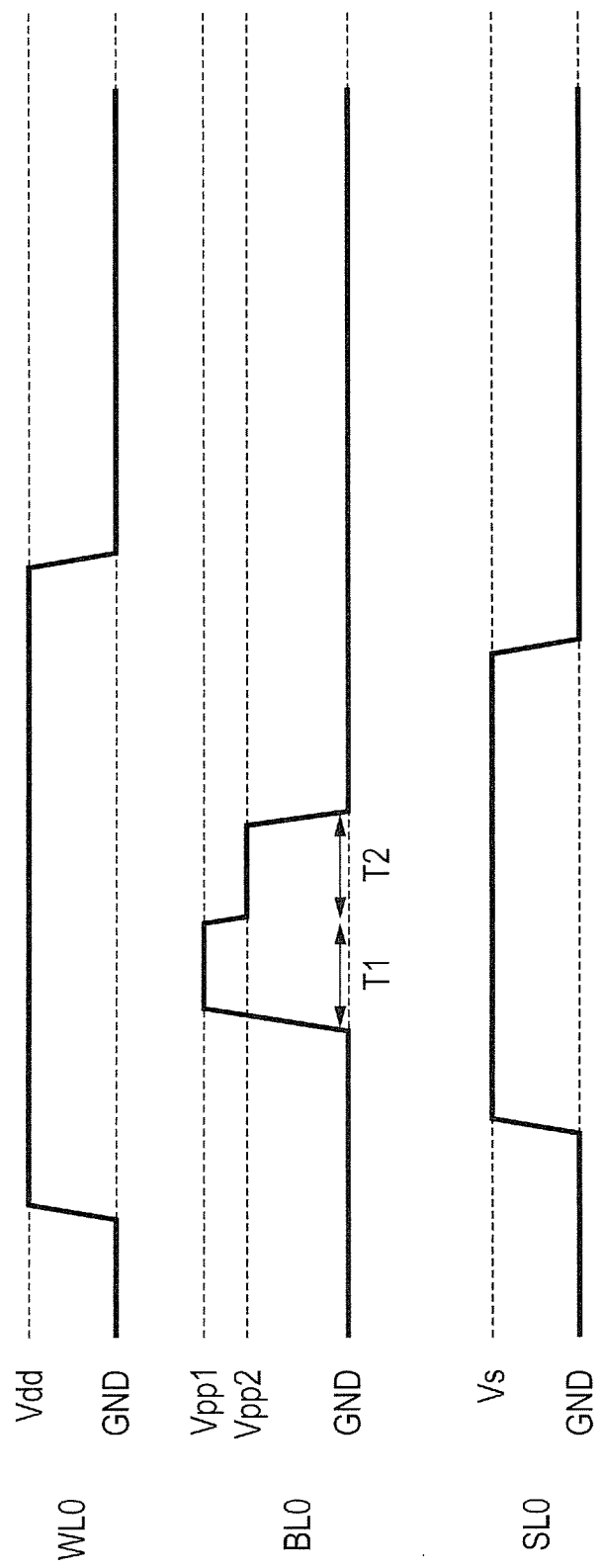
FIG. 4 is a timing chart of each potential supplied when writing, in the semiconductor device according to the embodiment.

FIG. 1 is an equivalent circuit diagram of a memory cell in the semiconductor device according to the embodiment. FIG. 2 is a top plan view of an important portion of the memory cell in the semiconductor device according to the embodiment. FIG. 3 is a cross-sectional view taken along the line A-A' and B-B' of FIG. 2. FIG. 4 is a timing chart of each potential supplied when writing, in the semiconductor device according to the embodiment.

Figure 5:
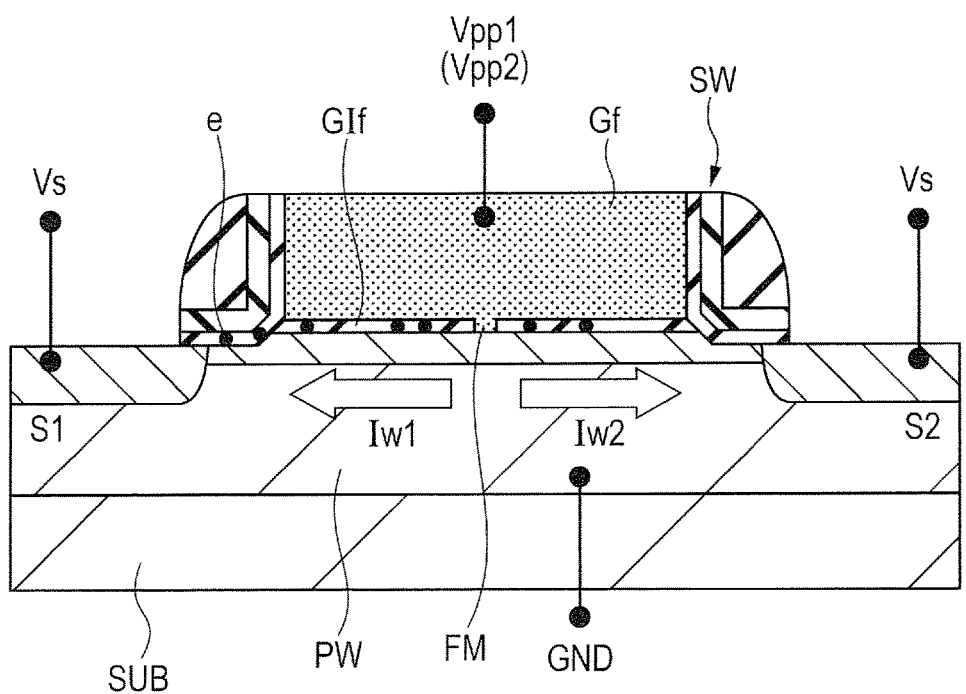
FIG. 5 is a cross-sectional view showing an anti-fuse element and each potential supplied when writing, in the semiconductor device according to the embodiment
Figure 6:
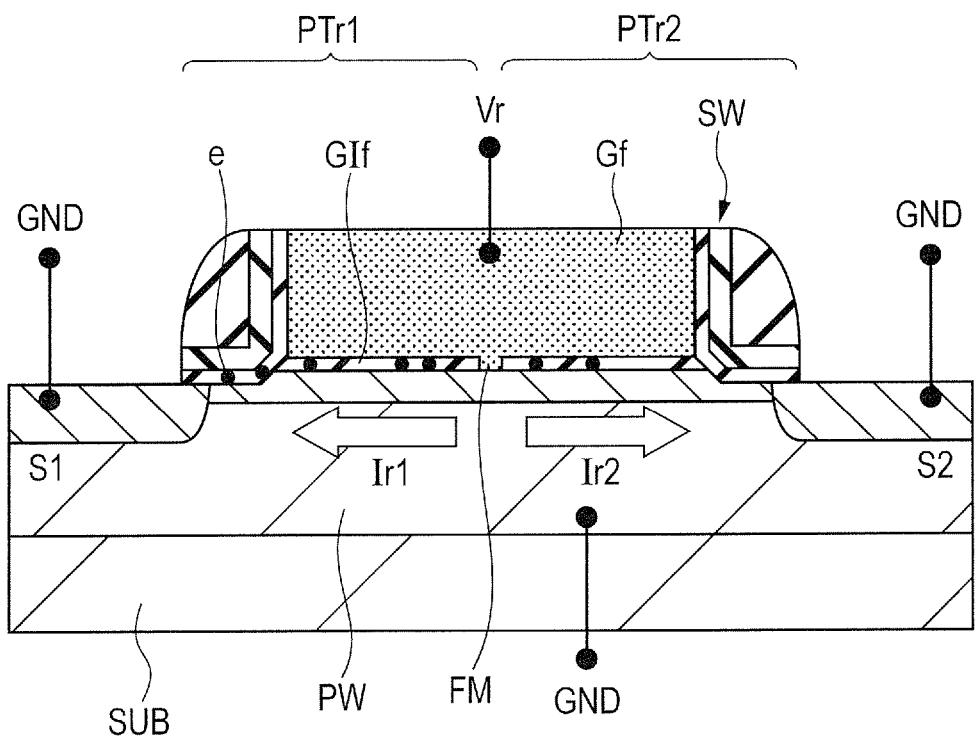
FIG. 6 is a cross-sectional view showing the anti-fuse element and each potential supplied when reading, in the semiconductor device according to the embodiment.
Figure 7:
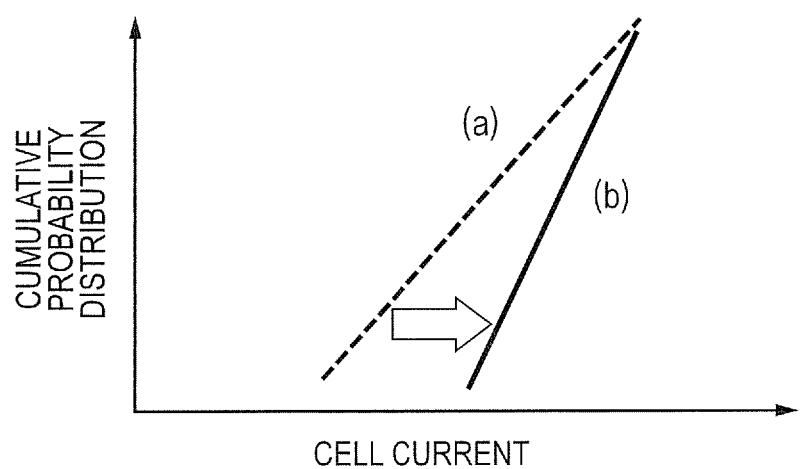
FIG. 7 is a graph showing a cumulative probability distribution of the cell current of a "writing cell" in the semiconductor device according to the embodiment.
Figure 8:
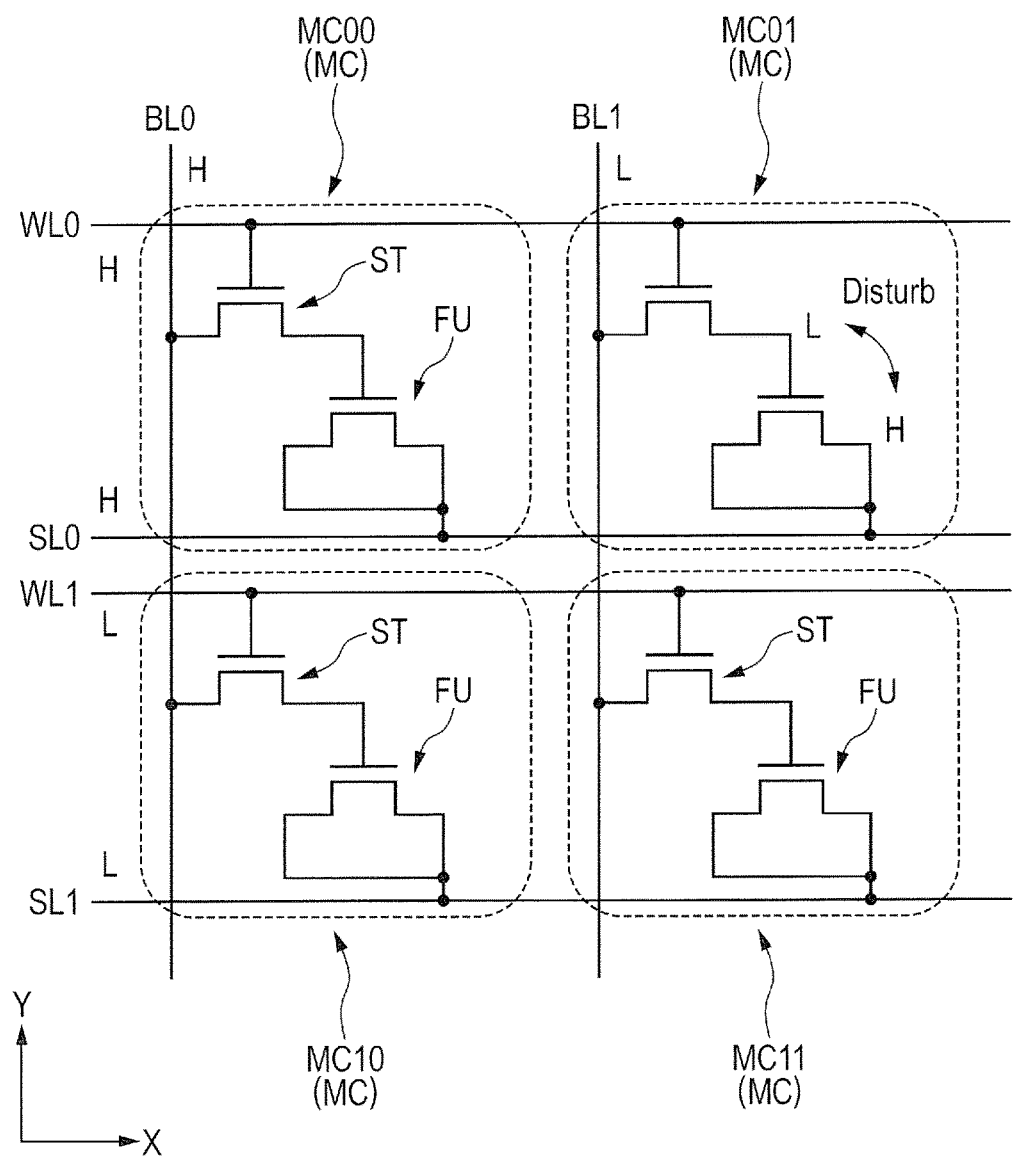
FIG. 8 is an equivalent circuit diagram of a memory cell as a comparison example.

FIG. 5 is a cross-sectional view showing an anti-fuse element and each potential supplied when writing, in the semiconductor device according to the embodiment. FIG. 6 is a cross-sectional view showing the anti-fuse element and each potential supplied when reading, in the semiconductor device according to the embodiment. FIG. 7 is a graph showing a cumulative probability distribution of the cell current of a "writing cell" in the semiconductor device according to the embodiment. FIG. 8 is an equivalent circuit diagram of a memory cell as a comparison example.

FIG. 1 is an equivalent circuit diagram of a memory cell, showing four memory cells MC (MC00, MC01, MC10 and MC11) arranged in a matrix shape.

The memory cell MC includes a select transistor (transistor element) ST and an anti-fuse element (anti-fuse, anti-fuse transistor) FU. The memory cells MC are coupled to a word line WL0 or WL1 extending in the X direction, a bit line BL0 or BL1 extending in the Y direction orthogonal to the X direction, and a source line SL0 or SL1 extending in the Y direction. Further, a power feeder PWF for supplying the predetermined potential to the well region forming a select transistor ST and the anti-fuse element FU is coupled to the memory cell MC. The source lines SL0 and SL1 are the wirings electrically independent of the power feeder PWF, and a potential different from the potential of the power feeder PWF can be supplied to the source lines SL0 and SL1. As shown in FIG. 1, for example, the memory cell MC00 is coupled to the word line WL0, the bit line BL0, and the source line SL0, further to the power feeder PWF extending in the X direction. The power feeder PWF can be extended in the Y direction, or in the X direction and the Y direction.

FIG. 2 is a top plan view of the four memory cells MC shown in FIG. 1. The memory cells MC00 and MC01 adjacent in the X direction are arranged in a mirror symmetry. The memory cells MC00 and MC10 adjacent in the Y direction have the same arrangement. Here, the memory cells MC00 and MC10 adjacent in the Y direction may be in a mirror arrangement. The arrangement is adopted to the memory cells MC arranged in the X direction and the Y direction.

Each memory cell MC has the same structure; hereinafter, the above structure will be described by using the memory cell MC00.

The memory cell MC00 includes the select transistor ST and the anti-fuse element FU. The select transistor ST includes a gate electrode Gs and a pair of source and drain regions SDs arranged at the both ends of the gate electrode Gs. The anti-fuse element includes a gate electrode Gf and source regions S1 and S2 arranged at the both ends of the gate electrode Gf.

The select transistor ST is formed within an active region ACTs and the anti-fuse element is formed within an active region ACTf. The active regions ACTs and ACTf are surrounded by an element isolation film STI. The active regions ACTs and ACTf have substantially rectangular shape. Here, the substantially rectangular shape includes a rectangle with rounded corners or an oval.

The longer side of the active region ACTs of the select transistor ST extends in the X direction and the gate electrode Gs extends in the Y direction to cross the active region ACTs. The longer side of the active region ACTf of the anti-fuse element FU extends in the Y direction and the gate electrode Gf extends in the X direction to cross the active region ACTf.

One of the source and drain regions SDs of the select transistor ST is coupled to the bit line BL0 through a plug electrode PG and the wiring W1. The other of the source and drain regions SDs of the select transistor ST is coupled to the gate electrode Gf of the anti-fuse element FU through the plug electrode PG, the wiring W1, and the plug electrode PG. The gate electrode Gs of the select transistor ST is coupled to the word line WL0 extending in the X direction through the plug electrode PG and the wiring W1. Further, the source regions S1 and S2 of the anti-fuse element FU is coupled to the source line SL0 extending in the Y direction through the plug electrode PG. Here, the wiring W1 is formed by a metal wiring layer in the first layer and the source line SL0 is formed by the wiring W1 extending in the Y direction. The wiring W2 is formed by a metal wiring layer in the second layer and the word line WL0 is formed by the wiring W2 extending in the X direction. The wiring W3 is formed by a metal wiring layer in the third layer and the bit line BL0 is formed by the wiring W3 extending in the Y direction.

A power feed region PTAP is a region for supplying a desired potential to the well region PW. The power feed region PTAP is arranged in the Y direction for every predetermined bit number (for example, 4 bits or 8 bits). The power feed region PTAP includes a p-type semiconductor region formed within the active region ACTpw extending in the X direction. The p-type semiconductor region has a higher concentration than the p-type well region PW and is coupled to the p-type well region PW. The p-type semiconductor region is formed by the wiring W2 through the plug electrode PG and the wiring W1 and coupled to the power feeder PWF extending in the X direction. The power feeder PWF overlaps the active region ACTpw where the p-type semiconductor region is formed. Here, the example of the power feeder PWF extending in the X direction is shown and in this case, even if the source line SL0 is provided independently of the power feeder PWF, the area of the memory cell is never enlarged. The power feeder PWF, however, can be formed by the wiring W3 and extended in the Y direction. Further, the power feeder PWF may be formed by both the wiring W2 extending in the X direction and the wiring W3 extending in the Y direction. The power feeder PWF, however, has to be electrically separated from the source line SL0 and preferably it should be formed in a layer separate from the source line SL0.

FIG. 3 shows the cross section of an important portion of the n-channel type select transistor ST and the n-channel type anti-fuse element FU forming the memory cell MC00. The select transistor ST is formed in the p-type well region PW formed on the main surface of the p-type semiconductor substrate SUB. Further, the select transistor ST is formed within the active region ACTs surrounded by the element isolation film STI formed by the insulating film such as a silicon oxide film. The select transistor ST includes the gate electrode Gs formed on the main surface of the semiconductor substrate SUB through the gate insulating film GIs and a pair of the source and drain regions SDs formed in the well region PW (or the semiconductor substrate SUB) at the both ends of the gate electrode Gs.

The gate insulating film GIs is formed of a silicon oxide film, a silicon oxynitride film, a silicon nitride film, a High-k insulating film or the film stack thereof. The gate electrode Gs is formed of a polycrystalline silicon film including n-type dopant such as phosphorus (P). The source and drain region SDs is formed by an n-type semiconductor region NMs of comparatively lower concentration referred to as "extension layer" and an n-type semiconductor region NHs of comparatively high concentration, and the semiconductor region NMs and the semiconductor region NHs contain n-type dopant such as phosphorus (P) or arsenic (As). Further, under the semiconductor region NMs, a p-type semiconductor region PM referred to as "halo layer" is formed in order to suppress the expansion of the depletion layer from the source and drain regions SDs.

The side wall insulating film SW is formed on the side wall (lateral surface) of the gate electrode Gs. The side wall insulating film SW is formed in three layer structure including a silicon oxide film, a silicon nitride film, and a silicon oxide film from the bottom; however, it is not restricted to this. The semiconductor regions NHs arranged at the both ends of the gate electrode Gs do not overlap the gate electrode Gs but they are offset from the gate electrode Gs for the width of the side wall insulating film SW. The semiconductor region NMs intervenes between the semiconductor region NHs and the gate electrode Gs and a part of the semiconductor region NMs overlaps the gate electrode Gs.

As shown in FIG. 3, the select transistor ST is covered with a plurality of layers of the insulating films IL1, IL2, IL3, and IL4, and the plural insulating films IL1, IL2, IL3, and IL4 mainly made of silicon oxide film contain the plug electrodes PG, PG2, and PG3 and the wirings W1, W2, and W3. The plug electrode PG is a column shaped metal conductive layer provided within a via opening formed in the insulating film ILI, formed in a stacked structure including a barrier film such as a tungsten nitride (TiW) film or a titanium nitride (TiN) film and a main conductive film such as tungsten (W). The barrier film is arranged on the side wall and the bottom of the via opening formed in the insulating film IL1 and the main conductive film is inwardly arranged there. The wiring W1 is a copper wiring formed within the wiring groove of the insulating film IL2 and the copper wiring is formed in a stacked structure including a barrier film made of tantalum (Ta), titanium (Ti) or the nitride thereof and a main conductive film made of copper or copper alloy. The wiring W1 has a single damascene structure.

The wiring W2 is a copper wiring formed within the wiring groove of the insulating film IL3, and the wiring W2 is coupled to the lower wiring W1 through the plug electrode PG2 formed within the via opening of the insulating film IL3. The wiring W2 and the plug electrode PG2 have a dual damascene structure and they are integrally formed. In other words, the barrier film made of tantalum (Ta), titanium (Ti), or the nitride thereof is formed on the side wall and the bottom of the wiring groove and the via opening and the main conductive film made of copper or copper alloy is formed on the barrier film within the wiring groove and the via opening. The wiring W3 has the same structure as the wiring W2 and its description is omitted.

As shown in FIG. 3, one of the source and drain regions SDs of the select transistor ST is coupled to the bit line BL0 formed by the wiring W3 through the plug electrode PG, the wiring W1, the plug electrode PG2, the wiring W2, and the plug electrode PG3. In FIG. 2, a pattern of the plug electrode PG2, the wiring W2, and the plug electrode PG3 is omitted. Further, the other of the source and drain regions SDs of the select transistor ST is coupled to the wiring W1 through the plug electrode PG.

The anti-fuse element FU is formed in the p-type well region PW formed in the main surface of the p-type semiconductor substrate SUB. Further, the anti-fuse element FU is formed within the active region ACTf surrounded by the element isolation film STI. The anti-fuse element FU includes the gate electrode Gf formed on the main surface of the semiconductor substrate SUB through the gate insulating film GIf and the source regions S1 and S2 formed in the well region PW (or the semiconductor substrate SUB) at the both ends of the gate electrode Gf.

The gate insulating film GIf is formed of a silicon oxide film, a silicon oxynitride film, a silicon nitride film, a High-k insulating film or the film stack thereof. Since the memory cell MC00 is the "writing cell", the filament FM made of a conductive film is formed in the gate insulating film GIf ranging from the gate electrode Gf to the surface of the well region PW, in other words, all over the main surface of the semiconductor substrate SUB. The gate electrode Gf is formed of a polycrystalline silicon film including n-type dopant such as phosphorus (P). The source regions S1 and S2 are formed by the semiconductor region NHf and the n-type semiconductor region NHf contains n-type dopant such as phosphorus (P) or arsenic (As). The semiconductor region NHf has the same dopant concentration as the semiconductor region NHs. Further, the n-type semiconductor region NMf is formed on the surface of the well region PW between the source region S1 and the source region S2. Further, the above mentioned side wall insulating film SW is formed on the side wall (lateral surface) of the gate electrode Gf. Further, the source regions S1 and S2 are coupled to the source line SL0 formed by the wiring W1 through the respective plug electrodes PG. The "extension layer" and "halo layer" of the above mentioned select transistor ST are not formed in the anti-fuse element FU.

Here, the filament FM formed to decouple the gate insulating film GIf is positioned in the medium point between the source regions S1 and S2, in other words, in the middle of the gate electrode Gf, in a direction of coupling the source regions S1 and S2.

Next, the case of writing into the memory cell MC00 will be described. As shown in FIG. 1, "High (hereinafter, referred to as H)" is applied to the select word line WL0, "Low (hereinafter, referred to as L)" is applied to the non-select word line WL1, "H" is applied to the select bit line BL0, "L" is applied to the non-select bit line BL1, "H" is applied to the select source line SL0, and "L" is applied to the non-select source line SL1.

FIG. 4 is a timing chart of each potential supplied to the select word line WL0, the select bit line BL0, and the select source line SL0, when writing into the memory cell MC00. At first, the select word line WL0 is raised from a first reference potential GND to a second reference potential Vdd ("H"). Then, the select source line SL0 is raised from the first reference potential GND to an intermediate potential Vs ("H"). (However, after the select source line SL0 is raised at first, the select word line WL0 may be raised). Then, the select bit line BL0 is raised from the first reference potential GND to the first writing potential Vpp1 ("H"), and during the time T1, it keeps applying the first writing potential Vpp1 to the select bit line BL0. This process corresponds to the above mentioned first stage. In short, in the first stage, the dielectric breakdown region is formed in the gate insulating film Gf of the anti-fuse element FU. Next, in the second stage, during the time T2, the second writing potential Vpp2 is applied to the select bit line BL0. In this second stage, the filament FM made of a conductive film is formed in the insulating film GIf of the anti-fuse element FU. Here, for example, the first reference potential GND is defined as 0 V, the second reference potential Vdd is defined as 1.5 V, the first writing potential Vpp1 is defined as 6 V, the second writing potential Vpp2 is defined as 4 V, and the intermediate potential Vs is defined as 3 V. The first reference potential GND 0 V is applied to the power feeder PWF shown in FIG. 1 and the well region PW where the anti-fuse element FU is formed is fixed at the first reference potential GND 0 V. The example of supplying the second writing potential Vpp2 lower than the first writing potential Vpp1 to the select bit line BL0, after the supply of the first writing potential Vpp1, is shown; however, the embodiment is not restricted to this, but only the first writing potential Vpp1 may be supplied to the select bit line BL0.

Here, it is important to supply a predetermined potential to the source regions S1 and S2 of the anti-fuse element FU, independently of the well region PW where the anti-fuse element FU is formed.

Further, it is important that the intermediate potential Vs is higher than the first reference potential GND and lower than the first writing potential Vpp1 (GND<Vs<Vpp1).

Further, it is important that the second writing potential Vpp2 is lower than the first writing potential Vpp1 (Vpp2<Vpp1).

Further, it is preferable that the second writing potential Vpp2 is higher than the intermediate potential Vs (Vpp2>Vs).

Further, it is important that the intermediate potential Vs is applied to the select source line SL0 before the first writing potential Vpp1 is applied to the select bit line BL0. Further, it is also important that the potential of the select source line SL0 is raised to the intermediate potential Vs before the potential of the select bit line SL0 is raised to the first writing potential Vpp1.

FIG. 5 shows each potential of each unit of the anti-fuse element FU in the memory cell MC00 when writing into the memory cell MC00. As shown in FIG. 5, independently of the first reference potential GND in the well region PW, the first writing potential Vpp1 is applied to the gate electrode Gf with the intermediate potential Vs applied to the source regions S1 and S2, and therefore, the filament FM formed in the gate insulating film GIf is formed in the middle point between the source regions S1 and S2. In other words, in a direction of coupling the source regions S1 and S2, the filament FM is formed in the middle of the gate electrode Gf. This is because since the equal intermediate potential Vs is applied to the both source regions S1 and S2, a potential difference between the gate electrode Gf and the well region PW gets highest in the middle of the gate electrode Gf, to form the dielectric breakdown region in the middle portion. In short, it is important that the source regions S1 and S2 are arranged at the both ends of the gate electrode Gf.

Although the writing process into the memory cell MC00 has been described, the writing into another memory cell is similarly performed; the filament FM of the "writing cell" is formed in the middle of the gate electrode Gf.

Since the filament FM is formed in the middle of the gate electrode Gf, a high electric field does not occur between the filament FM and the source region S1 or S2, as mentioned above; therefore, the hot electrons e trapped in the gate insulating film GIf or the side wall insulating film SW can be reduced.

FIG. 6 shows each potential of each unit of the anti-fuse element FU in the "writing cell" when reading. As mentioned above, during the reading, the reading potential Vr (for example, 1.5 V) is applied to the gate electrode Gf, the first reference potential GND is applied to the source regions S1 and S2 and the well region PW, and whether the "writing cell" or "non-writing cell" is determined according to the sum of the cell current Ir1 of the parasitic transistor PTr1 and the cell current Ir2 of the parasitic transistor PTr2.

As mentioned above, the hot electrons e trapped in the gate insulating film GIf or the side wall insulating film SW can be reduced, hence to avoid an increase in the threshold value of the parasitic transistor PTr1 or PTr2 or to reduce the threshold value thereof. Further, since the parasitic transistors PTr1 and PTr2 can be equal in the channel length, it is possible to avoid a reduction of the cell current Ir1 or Ir2 caused by a deviation of the channel length.

In short, by forming the filament FM in the middle of the gate electrode Gf, the cell currents Ir1 and Ir2 can be increased and the bits with lower cell current can be reduced, thereby improving the writing yield.

In the embodiment, although the select transistor ST and the anti-fuse element FU have been described as the n-channel type, the both may be the p-channel type.

<Characteristic of Semiconductor Device of Embodiment>

A predetermined potential can be supplied to the source regions S1 and S2 of the anti-fuse element FU, independently of the well region PW where the anti-fuse element FU is formed; therefore, the filament FM of the "writing cell" can be formed in the middle of the gate electrode Gf. Accordingly, the cell currents Ir1 and Ir2 in the reading can be increased and the bits with lower cell current can be reduced, hence to improve the writing yield. As shown by (b) in FIG. 7, in the embodiment, the bits with lower cell current can be reduced. The reference code (a) in FIG. 7 corresponds to a comparison example, showing an example of supplying the first reference potential GND equal to the potential of the well region PW, to the source regions S1 and S2 of the anti-fuse element FU in the writing process.

The intermediate potential Vs, higher than the first reference potential GND and lower than the first writing potential Vpp1, is applied to the source regions S1 and S2 when writing, independently of the first reference potential GND of the well region PW, which makes it possible to form the filament FM formed in the gate insulating film GIf, in the middle of the gate electrode Gf. The parasitic transistors PTr1 and PTr2 can be equal in the channel length when reading, hence to increase the cell current in the reading. Further, the hot electrons e trapped in the gate insulating film GIf or the side wall insulating film SW can be reduced, hence to increase the cell current in the reading.

In the second stage of the writing, by applying the second writing potential Vpp2 lower than the first writing potential Vpp1 to the gate electrode Gf, the hot electrons e trapped in the gate insulating film GIf or the side wall insulating film SW can be further reduced, hence to increase the cell current in the reading.

In the second state of the writing, by supplying the second writing potential Vpp2 higher than the intermediate potential Vs of the source regions S1 and S2 to the gate electrode Gf and running the writing currents Iw1 and Iw2 from the gate electrode Gf to the source regions S1 and S2, the filament FM with lower resistance made of n-type conductive layer can be formed within the gate insulating film GIf. Accordingly, the cell current in the reading can be increased, hence to improve the reading characteristic. On the contrary, in Japanese Unexamined Patent Application Publication No. 2006-59919, for example, according to the potential relation at a program, the writing current like the embodiment does not flow; therefore, the epitaxial layer EP is not formed in the dielectric breakdown region and the filament FM made of a conductive layer cannot be formed easily.

By raising the select bit line BL0 after raising the select source line SL0 when writing, the filament FM can be avoided from deviating from the middle portion to the side of the source region S1 or S2.

By coupling the source line SL0 to a plurality of memory cells MC00 and MC10 coupled to the bit line BL0, the non-select cell can be avoided from disturbance (see "Disturb" between "H" and "L" in FIG. 8). FIG. 8 is an equivalent circuit diagram of a memory cell as a comparison example. In FIG. 8, the source line SL0 is coupled to a plurality of memory cells MC00 and MC01 coupled to the word line WL0. As shown in FIG. 8, when writing into the select memory cell MC00, a potential difference occurs between the gate electrode and the source regions S1 and S2 of the anti-fuse element FU in the non-select memory cell MC01; therefore, there is a danger of writing data in the anti-fuse element FU of the non-select memory cell MC01.

MODIFIED EXAMPLE 1

Figure 13:
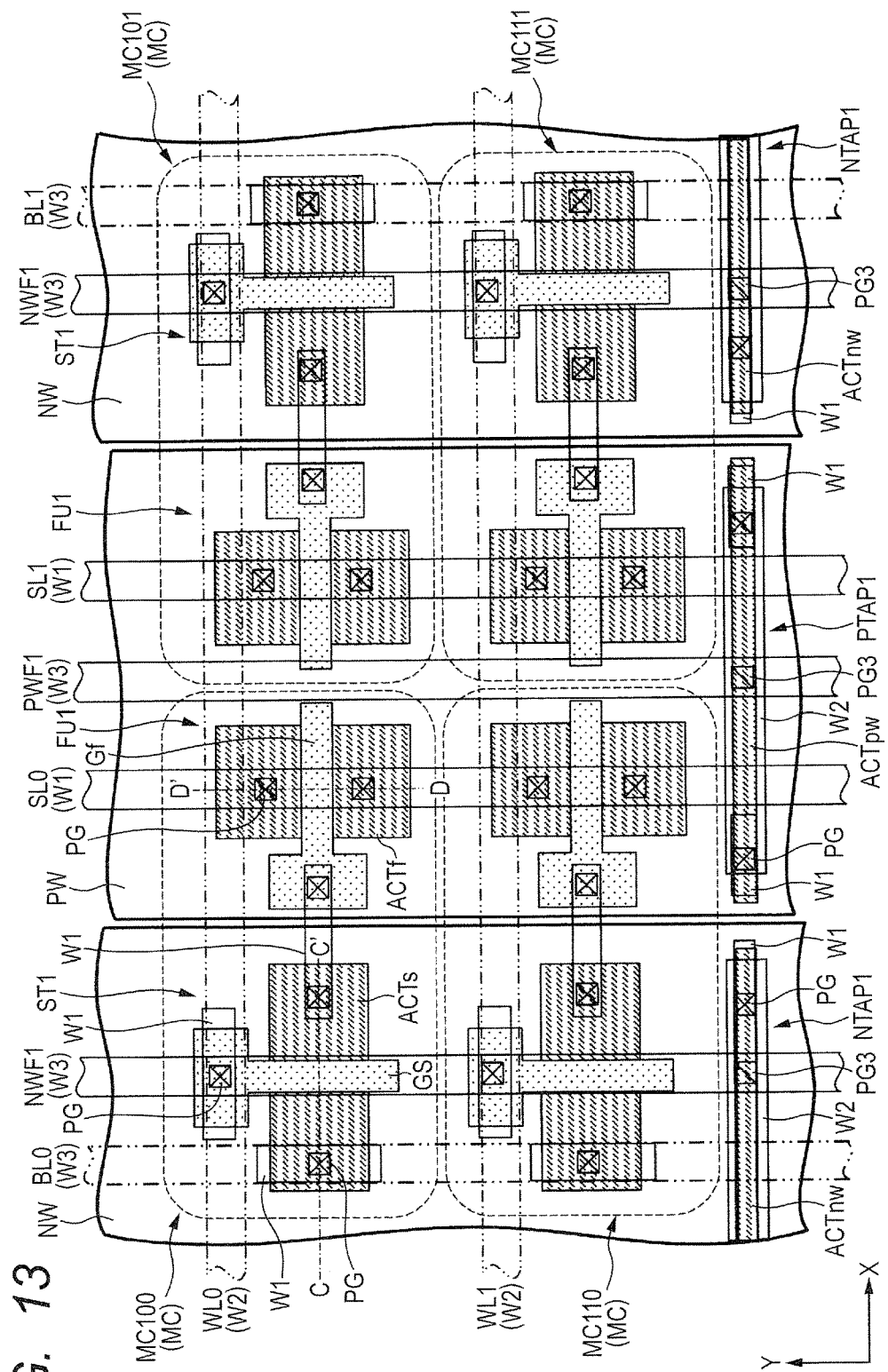
FIG. 13 is a top plan view of an important portion of a memory cell in a semiconductor device according to a modified example 1.
Figure 14:
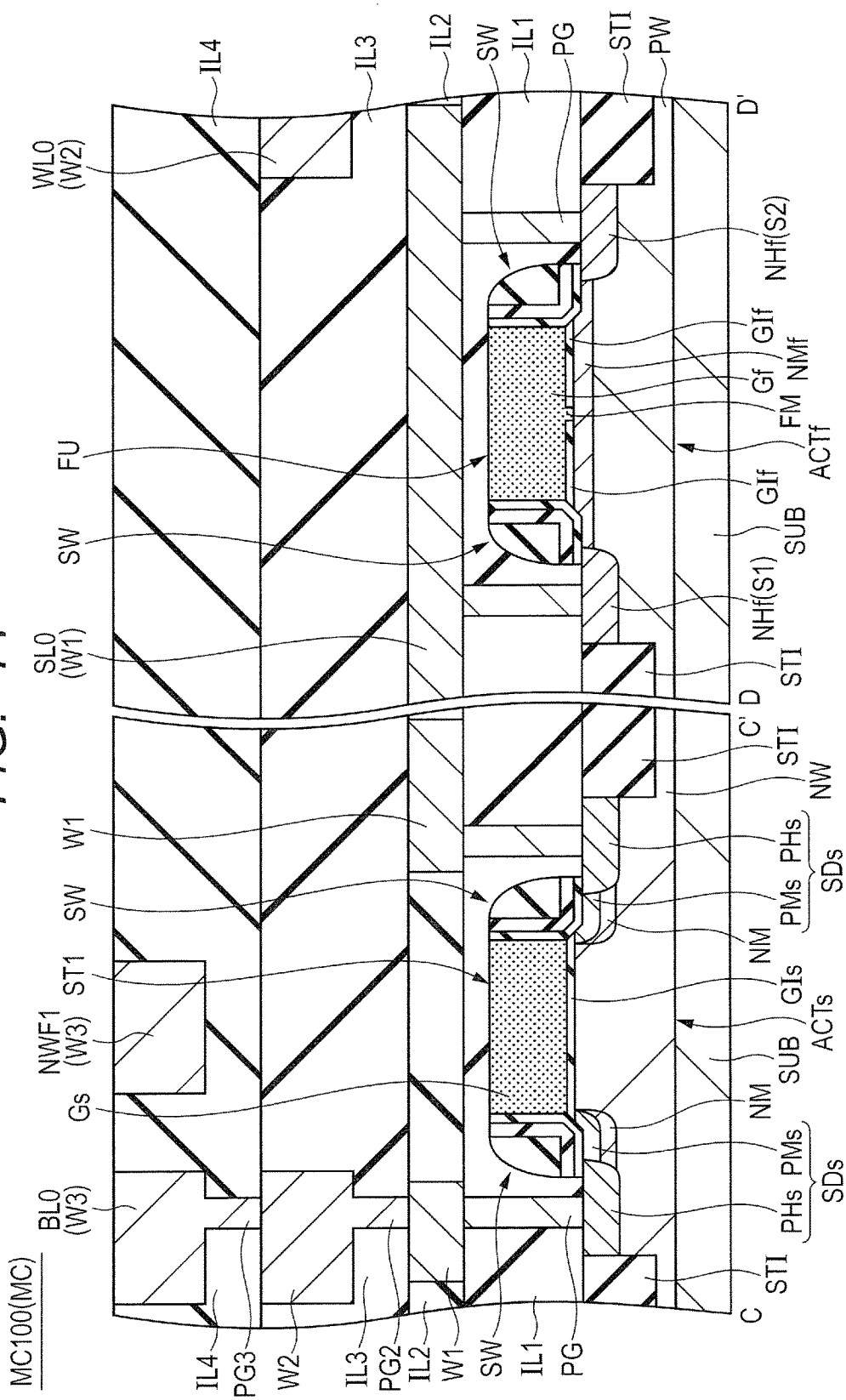
FIG. 14 is a cross-sectional view taken along the line C-C' and the line D-D' of FIG. 13.

A modified example 1 is a modified example of the above embodiment, in which the select transistor of the memory cell is formed by P channel type MISFET. FIG. 13 is a top plan view of an important portion of the memory cell in a semiconductor device according to the modified example 1. FIG. 14 is a cross-sectional view taken along the line C-C' and D-D' of FIG. 13.

FIG. 13 is the modified example of the above embodiment in FIG. 2, showing four memory cells MC (MC100, MC101, MC110, and MC111). The arrangement of the respective memory cells MC is the same as that of the above embodiment. Hereinafter, a different point from FIG. 2 will be described.

The memory cell MC includes the select transistor ST1 formed by the p-channel type MISFET and the anti-fuse element FU1 formed by the n-channel type MISFET.

As shown in FIG. 13, the well region PW as the p-type semiconductor region extending in the Y direction and the well region NW as the n-type semiconductor region extending in the Y direction are alternately arranged in the X direction. Two anti-fuse elements FU1 of the memory cells MC100 and MC101 adjacent in the X direction are arranged within the common well region PW. Although it is not shown, two select transistors ST1 of the two memory cells MC adjacent in the X direction are arranged within the common well region NW. According to the above arrangement, the number of the well regions PW and NW in the X direction can be reduced, hence to highly integrate the memory cell.

As shown in FIG. 13, the power feed regions PTAP1 and NTAP1 are formed in the well regions PW and NW. The power feed regions PTAP1 and NTAP1 are arranged for every predetermined number of bits in the Y direction (for example, four bits or eight bits).

The power feed region PTAP1 includes the p-type semiconductor region formed within the active region ACTpw extending in the X direction. The p-type semiconductor region is a semiconductor region with higher concentration than that of the p-type well region PW and coupled to the p-type well region PW. The p-type semiconductor region is coupled to the power feeder PWF1 (wiring W3) made by the third metal wiring layer extending in the Y direction through the plug electrode PG, the wiring W1, the plug electrode PG2 (not shown), and the wiring W2 and the plug electrode PG3.

The power feeder PWF1 extending in the Y direction is arranged between the source lines SL0 and SL1 adjacently extending in the Y direction. The power feeder PWF1 is formed by the wiring W3 that is the third metal wiring layer, and the source lines SL0 and SL1 are formed by the wiring W1 that is the first metal wiring layer. The memory cell can be highly integrated by forming by source lines SL0 and SL1 in a different wiring layer.

The power feed region NTAP1 includes the n-type semiconductor region formed within the active region ACTnw extending in the X direction. The n-type semiconductor region is a semiconductor region with higher concentration than that of the n-type well region NW and coupled to the n-type well region NW. The n-type semiconductor region is coupled to the power feeder NWF1 (wiring W3) made by the metal wiring layer of the third layer extending in the Y direction through the plug electrode PG, the wiring W1, the plug electrode PG2 (not shown), the wiring W2, and the plug electrode PG3.

The power feeder NWF1 extending in the Y direction is arranged on the select transistor ST1. The power feeder NWF1 is arranged to overlap the select transistor ST1, hence to highly integrate the memory cell.

As shown in FIG. 14, the select transistor ST1 is formed in the n-type well region NW formed on the main surface of the p-type semiconductor substrate SUB. The gate electrode Gs of the select transistor ST1 contains the p-type dopant such as boron (B). The source and drain region SDs of the select transistor ST1 includes a p-type semiconductor region PMs with comparatively lower concentration and a p-type semiconductor region PHs with comparatively higher concentration, and the semiconductor region PMs and the semiconductor region PHs contain the p-type dopant such as boron (B). Further, the n-type semiconductor region NM called "halo layer" is formed under the semiconductor region PMs to suppress the extension of the depletion layer from the source and drain region SDs.

MODIFIED EXAMPLE 2

Figure 15:
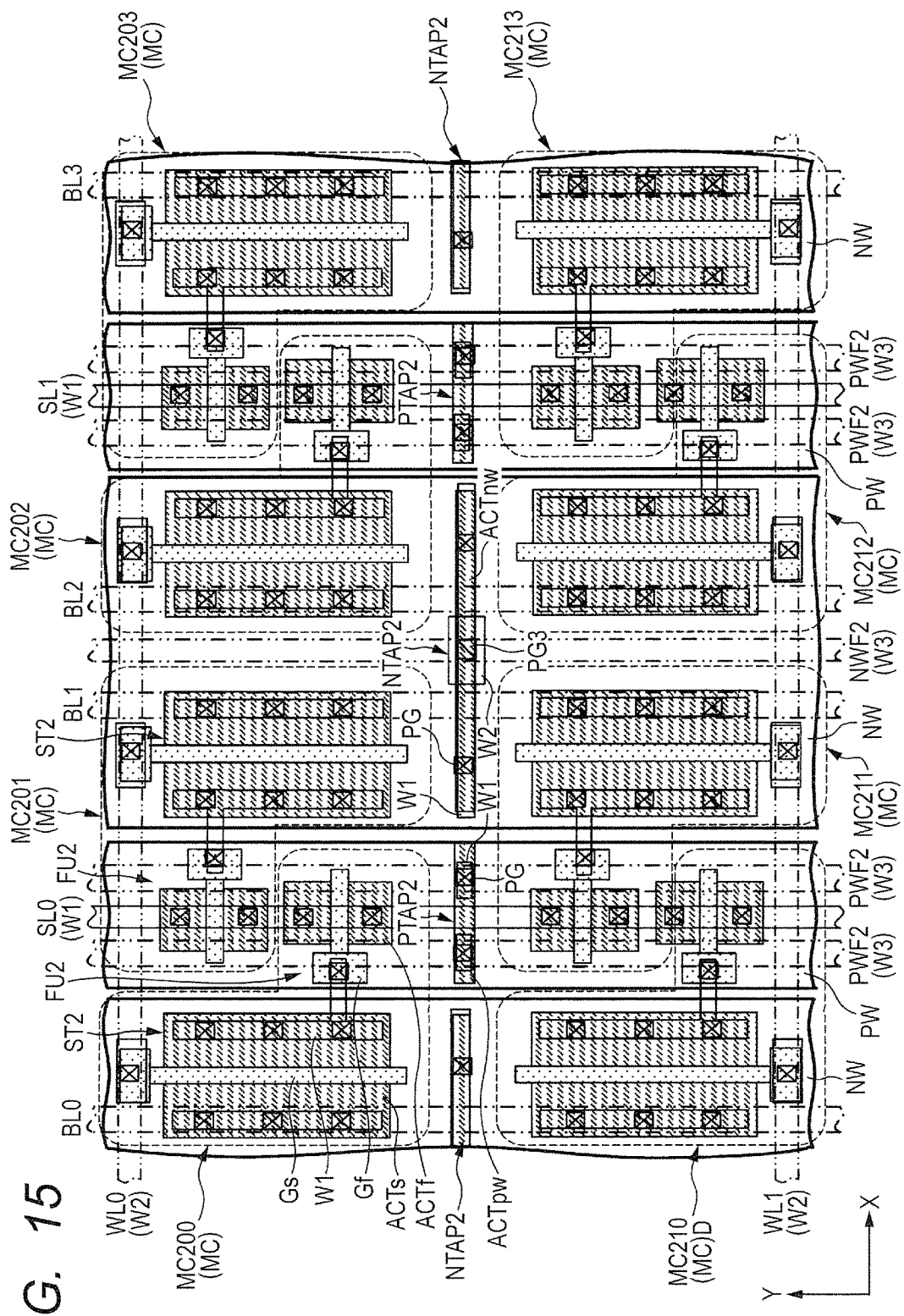
FIG. 15 is a top plan view of an important portion of a memory cell in a semiconductor device according to a modified example 2.

A modified example 2 is a modified example of the above modified example 1 in FIG. 13. FIG. 15 is a top plan view of an important portion of the memory cell in a semiconductor device according to the modified example 2. FIG. 15 is different from FIG. 13 mainly in that the select transistor is enlarged in the Y direction and that the anti-fuse elements of the memory cells adjacent in the X direction are arranged in one line in the Y direction.

FIG. 15 shows eight memory cells MC (MC200, MC201, MC202, MC203, MC210, MC211, MC212, and MC213) arranged in a matrix shape in the X direction and in the Y direction.

The memory cell MC includes the select transistor ST2 formed by the p-channel type MISFET and the anti-fuse element FU2 formed by the n-channel type MISFET.

The active region ACTs of the select transistor ST2 is twice longer than the active region ACTf of the anti-fuse element FU2 in the Y direction. Since the on current of the select transistor ST2 can be enlarged, data writing and reading can be performed on the memory cell MC at high speed.

Further, two anti-fuse elements FU2 in the adjacent memory cells MC200 and MC201 are arranged to overlap each other in the Y direction. Further, the source regions S1 and S2 of the two anti-fuse elements FU2 in the adjacent memory cells MC200 and MC201 are coupled to one source line SL0. As the result, the memory cell can be highly integrated in the X direction.

Although the select transistor ST2 is the p-channel type, it may be the n-channel type.

As set forth hereinabove, the invention made by the inventor et al. has been specifically described based on the embodiments; however, it is needless to say that the invention is not restricted to the above embodiments but that various modifications are possible without departing from the spirit.

What is claimed is:
1. A semiconductor device comprising:
a semiconductor substrate including a main surface;
a plurality of memory cells each including an anti-fuse element, arranged in the main surface in a matrix shape, in a first direction and a second direction orthogonal to each other;
a word line extending in the first direction, coupled to the memory cells arranged in the first direction;
a bit line extending in the second direction, coupled to the memory cells arranged in the second direction;
a source line coupled to the memory cells; and
a power feeder coupled to the memory cells,
wherein the anti-fuse element includes
a first semiconductor region of a first conductivity type formed in the semiconductor substrate,
a first gate electrode formed over the main surface through a first gate insulating film,
second and third semiconductor regions of a second conductivity type opposite to the first conductivity type, formed within the first semiconductor region at both ends of the first gate electrode, and
a fourth semiconductor region formed on a top surface of the first semiconductor region between the second and the third semiconductor regions before a writing operation is performed in the anti-fuse element,
wherein the source line is coupled to the second semiconductor region and the third semiconductor region,
wherein the power feeder is coupled to the first semiconductor region,
wherein the source line is electrically separated from the power feeder, to be able to supply a potential different from the potential of the first semiconductor region to the second semiconductor region and the third semiconductor region, and
wherein, extending in the second direction, the source line is coupled to the memory cells arranged in the second direction.
2. The device according to claim 1,
wherein during the writing operation to write information into each memory cell, a first potential is supplied to the first gate electrode, a second potential is supplied to the first semiconductor region, a third potential is supplied to the second semiconductor region and the third semiconductor region, and the third potential is lower than the first potential and higher than the second potential.
3. The device according to claim 1,
wherein each memory cell includes a select transistor including a second gate electrode formed over the main surface of the semiconductor substrate through a second gate insulating film and fifth and sixth semiconductor regions formed at both ends of the second gate electrode;
wherein the second gate electrode is coupled to the word line,
wherein the fifth semiconductor region is coupled to the bit line, and
wherein the sixth semiconductor region is coupled to the first gate electrode.
4. The device according to claim 3, further comprising a seventh semiconductor region of the first conductivity type, adjacent to the first semiconductor region in the first direction and extending in the second direction,
wherein the fifth semiconductor region and the sixth semiconductor region are of the second conductivity type and formed within the seventy semiconductor region.

5. The semiconductor device according to claim 1, wherein both the second and third semiconductor regions are source regions.

6. The semiconductor device according to claim 5, wherein the source line is directly coupled to both of the source regions.

7. A semiconductor device comprising:
a semiconductor substrate including a main surface;
a plurality of memory cells each including an anti-fuse element, arranged in the main surface in a matrix shape, in a first direction and a second direction orthogonal to each other;
a word line extending in the first direction, coupled to the memory cells arranged in the first direction;
a bit line extending in the second direction, coupled to the memory cells arranged in the second direction;
a source line coupled to the memory cells; and
a power feeder coupled to the memory cells,
wherein the anti-fuse element includes
a first semiconductor region of a first conductivity type formed in the semiconductor substrate,
a first gate electrode formed over the main surface through a first gate insulating film,
second and third semiconductor regions of a second conductivity type opposite to the first conductivity type, formed within the first semiconductor region at both ends of the first gate electrode, and
a fourth semiconductor region formed on a top surface of the first semiconductor region between the second and the third semiconductor regions before a writing operation is performed in the anti-fuse element,
wherein the source line is coupled to the second semiconductor region and the third semiconductor region,
wherein the power feeder is coupled to the first semiconductor region,
wherein the source line is electrically separated from the power feeder, to be able to supply a potential different from the potential of the first semiconductor region to the second semiconductor region and the third semiconductor region,
wherein the memory cell includes a select transistor including a second gate electrode formed over the main surface of the semiconductor substrate through a second gate insulating film and fifth and sixth semiconductor regions formed at both ends of the second gate electrode;
wherein the second gate electrode is coupled to the word line,
wherein the fifth semiconductor region is coupled to the bit line,
wherein the sixth semiconductor region is coupled to the first gate electrode,
wherein the semiconductor device further comprises first and second active regions surrounded by an element isolation film, in the main surface of the semiconductor substrate,
wherein the anti-fuse element is formed in the first active region and the first gate electrode crossing the first active region extends in the first direction, and
wherein the select transistor is formed in the second active region and the second gate electrode crossing the second active region extends in the second direction.

8. A semiconductor device comprising:
a semiconductor substrate including a main surface;
a plurality of memory cells each including an anti-fuse element, arranged in the main surface in a matrix shape, in a first direction and a second direction orthogonal to each other;
a word line extending in the first direction, coupled to the memory cells arranged in the first direction;
a bit line extending in the second direction, coupled to the memory cells arranged in the second direction;
a source line coupled to the memory cells; and
a power feeder coupled to the memory cells,
wherein the anti-fuse element includes
a first semiconductor region of a first conductivity type formed in the semiconductor substrate,
a first gate electrode formed over the main surface through a first gate insulating film,
second and third semiconductor regions of a second conductivity type opposite to the first conductivity type, formed within the first semiconductor region at both ends of the first gate electrode, and
a fourth semiconductor region formed on a top surface of the first semiconductor region between the second and the third semiconductor regions before a writing operation is performed in the anti-fuse element,
wherein the source line is coupled to the second semiconductor region and the third semiconductor region,
wherein the power feeder is coupled to the first semiconductor region,
wherein the source line is electrically separated from the power feeder, to be able to supply a potential different from the potential of the first semiconductor region to the second semiconductor region and the third semiconductor region,
wherein the memory cell includes a select transistor including a second gate electrode formed over the main surface of the semiconductor substrate through a second gate insulating film and fifth and sixth semiconductor regions formed at both ends of the second gate electrode;
wherein the second gate electrode is coupled to the word line,
wherein the fifth semiconductor region is coupled to the bit line,
wherein the sixth semiconductor region is coupled to the first gate electrode,
wherein the fifth semiconductor region and the sixth semiconductor region are of the second conductivity type and formed within the first semiconductor region, and
wherein the power feeder extends in the first direction.

* * * * *